(12) United States Patent
Yanagawa

(10) Patent No.: US 6,542,392 B2
(45) Date of Patent: Apr. 1, 2003

(54) CONTENT ADDRESSABLE MEMORY DEVICES DETERMINING ENTRY DATA PRIORITY BY VALID DATA LENGTH

(75) Inventor: Miki Yanagawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/080,559

(22) Filed: Feb. 25, 2002

(65) Prior Publication Data
US 2002/0145899 A1 Oct. 10, 2002

(30) Foreign Application Priority Data
Apr. 5, 2001 (JP) .................................... 2001-107444

(51) Int. Cl.⁷ ............................................. G11C 15/00
(52) U.S. Cl. ........................ 365/49; 365/168; 711/108
(58) Field of Search ..................... 365/49, 168, 189.07; 711/108

(56) References Cited

U.S. PATENT DOCUMENTS 6,081,440 A * 6/2000 Washburn et al. ............ 365/49
6,389,506 B1 * 5/2002 Ross et al. ................... 711/108
6,418,042 B1 * 7/2002 Srinivasan et al. ........... 365/49

* cited by examiner

Primary Examiner—Tan T. Nguyen
(74) Attorney, Agent, or Firm—Arent Fox Kintner Plotkin & Kahn, PLLC

(57) ABSTRACT

A content addressable memory device which determines the top priority entry data without assigning priorities to addresses. If ternary data stored in a cell is invalid data, and other cell at the same bit position stores valid data of entry data identical to an entry key, the entry data is determined not to be a candidate of the top priority entry data. The last entry data which has not determined not to be a candidate is determined to be the top priority data. Compared to the conventional technology which relied on the relationship between a memory address and a priority, the performance of memory system is significantly improved.

8 Claims, 16 Drawing Sheets

CONTENT ADDRESSABLE MEMORY DEVICES DETERMINING ENTRY DATA PRIORITY BY VALID DATA LENGTH

BACKGROUND OF THE INVENTION

1. Field of the Invention

The present invention generally relates to content addressable memory devices, and more particularly, to a content addressable memory device which determines the top priority entry data by checking the length of valid data.

2. Description of the Related Art

A content addressable memory device (CAM) is a memory device which determines, in response to a data input, an address storing data equal to the input data in a memory area, and outputs the address. The input data is called an entry key and the data stored in the address is called an entry data.

While an address input to an ordinary semiconductor memory device specifies unique data, data input to a CAM device does not always specify a unique address because a plurality of addresses in a CAM device may store data equal to the input data. In the case that a plurality of addresses store data equal to the input data, a CAM device determines an output address by checking not only data stored in the addresses but also a predetermined priority assigned to the data. An address which stores entry data having the highest priority is output.

However, the priority is generally assigned to addresses, instead of data, and an address having the highest priority is output. The highest priority is, for example, assigned to the lowest address and a higher address has a lower priority. If a plurality of entry data is equal to an entry key, the lowest address storing an entry data equal to the entry key is determined and output.

Under the configuration described above, if new entry data having a predetermined priority is to be added to an existing entry data set, the new entry data must be inserted into the existing entry data arranged in the order of priority. For example, if new entry data having the third priority is to be added to an existing entry data set, an address to store the new entry data must be secured by shifting entry data stored in addresses higher than the third address to the next addresses. In this manner, new entry data must be stored in an address secured for the new entry data by shifting a part of an existing entry data set which is necessary to be shifted in an address space.

As described above, a method in which a priority is assigned to an address instead of entry data and entry data is stored in the address having the priority, will exhibit a low performance because a part of the entry data set must be shifted when new entry data is inserted into the entry data set.

SUMMARY OF THE INVENTION

Accordingly, it is a general object of the present invention to provide a novel and useful content addressable memory in which one or more of the problems described above are eliminated.

Another and more specific object of the present invention is to provide a content addressable memory which can determine entry data having the top priority without assigning priorities to addresses.

A content addressable memory device according to the present invention includes ternary cells which are arranged in rows and columns, and each stores therein "0", "1", or invalid data, wherein both "0" and "1" are valid data, valid data detection circuits, each of which is provided for a corresponding one of the ternary cells, and longest-match detection circuits, each of which is provided for a corresponding one of the ternary cells, wherein a valid data detection circuit provided for a first ternary cell located at a given bit position in a first row informs a second ternary cell located at the given bit position on a second row of presence of valid data if the first ternary cell has valid data stored therein and if entry data of the first row matches an entry key, and a longest-match detection circuit provided for the second ternary cell located at the given bit position on the second row finds entry data of the second row to be invalid if the second ternary cell has invalid data stored therein and if the valid data detection circuit is informing the longest-match detection circuit of the presence of valid data.

Each ternary cell relative to the present invention is provided with a function of informing other ternary cells of the existence of valid data for determining the longest match entry data. By this informing function, the ternary cell informs other ternary cells at the same bit position that the ternary data stored in the ternary cell is valid if the entry data which the ternary cell contains to is identical to the entry key. Once the existence of valid data is reported, the other ternary cells at the same bit position determine if invalid data is stored in their cell, in which case the cell turns from a state indicating storage of identical data to another state indicating that no identical data is stored.

As described above, if the content of a cell is invalid data, and another cell at the same bit position stored valid data, the cell determines that the entry data of the cell is not the top priority entry data, and excludes its entry data from the top priority data candidates.

Other objects, features, and advantages of the present invention will become more apparent from the following detailed description when read in conjunction with the accompanying drawings.

DETAIL DESCRIPTION OF THE PREFERRED EMBODIMENTS

A detailed description of the embodiments of the present invention will be given with reference to the drawings.

First, the principle of the present invention is described in preparation for the understanding of embodiments.

Figure 1:
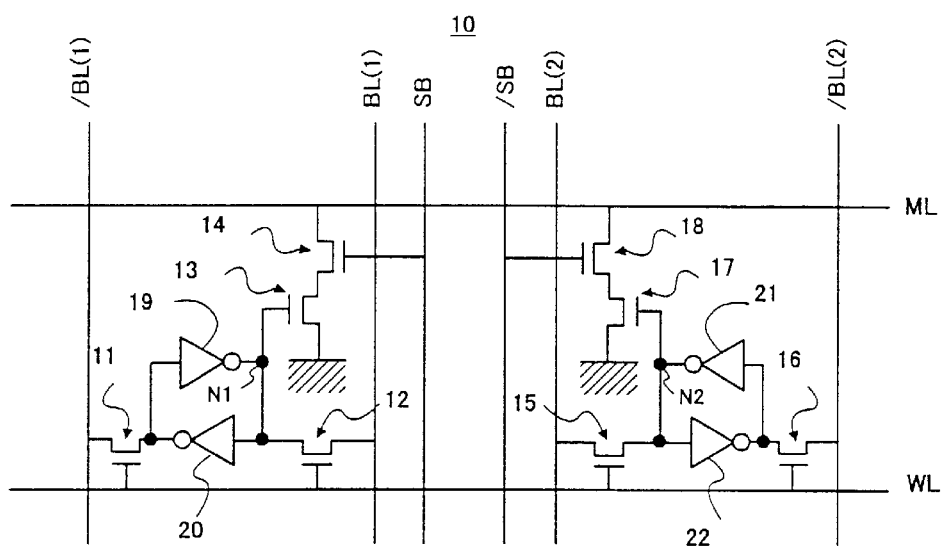
FIG. 1 is a circuit diagram of a ternary cell of a CAM device relative to prior art.

In a CAM device, an entry key and entry data are expressed as ternary data of 1, 0, and x (a mask or a mask prefix). FIG. 1 shows a generally used ternary cell.

A ternary cell 10 includes NMOS transistors 11–18 and inverters 19–22. The inverters 19 and 20 form a latch for storing 1 bit, and the inverters 21 and 22 form another latch for storing 1 bit. When the ternary cell 10 stores 1, a node N1 is set at 0 and a node N2 is set at 1. When the ternary cell 10 stores 0, the node N1 is set at 1 and the node N2 is set at 0. When the ternary cell 10 stores x (a mask or a mask prefix), both nodes N1 and N2 are set at 0. In order to store data in the ternary cell 10, signals corresponding to the data are provided to bit lines BL(1), /BL(1), BL(2), and /BL(2), and a word line WL is activated.

An entry key is provided through search buses SB and /SB. If the entry key is 1, the search buses SB and /SB are set at 1 and 0, respectively. If the entry key is 0, the search buses SB and /SB are set at 0 and 1, respectively. If the entry key is x, both search buses SB and /SB are set at 0. Accordingly, if the entry key and the entry data are either 0 or 1 and equal to each other, a match line ML remains at a HIGH level. If the entry key and the entry data are either 0 or 1 and not equal to each other, the match line ML turns to a LOW level since the NMOS transistors either 13 and 14, or 17 and 18 turn on simultaneously, and the match line ML is connected to the ground. If either the entry key or the entry data is a mask x, the match line ML remains at the HIGH level.

The ternary cells 10 are connected in parallel, and determine whether the entry key having a plurality of bits is equal to the entry data.

Figure 2:
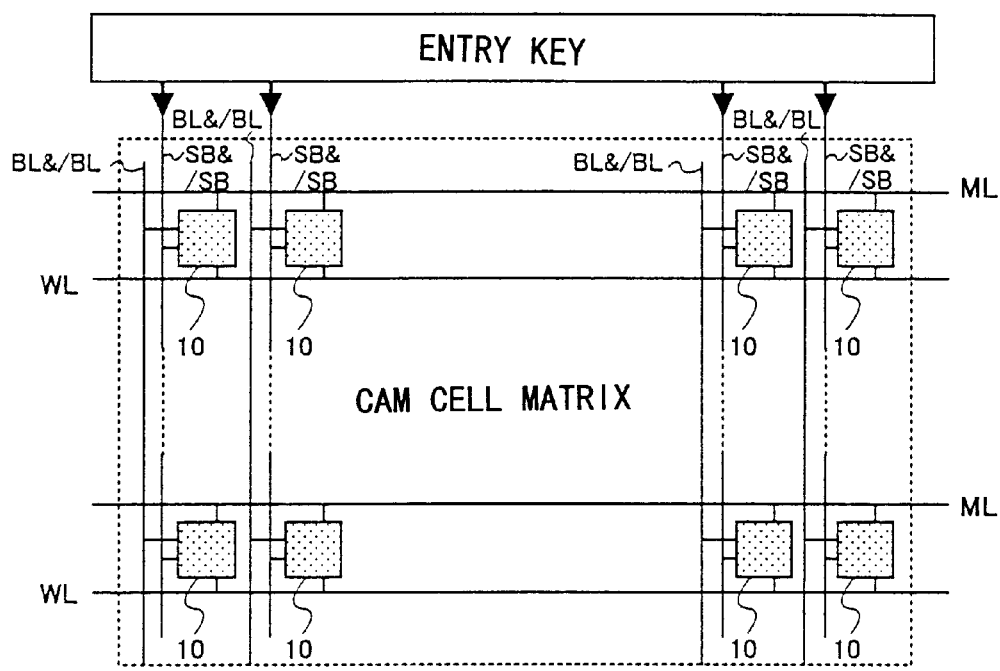
FIG. 2 is a schematic drawing of a cell matrix in which ternary cells are provided in rows and columns.

FIG. 2 shows a matrix in which ternary cells 10 are provided to every row and every column. Ternary cells 10 in a row have a common match line ML as shown in FIG. 2. If an entry key provided through search buses SB and /SB is exactly equal to entry data, which is a series of data stored in ternary cells 10 provided in a row, a match line ML remains at a HIGH level. If the entry key and the entry data are different from each other, even in one ternary cell, the match line ML turns to a LOW level because the match line ML is connected to the ground at the ternary cell.

If a mask x is included in either the entry key or the entry data, the match line corresponding to the position of the mask x does not turn to a HIGH level, that is, the ternary cell 10 is irrelevant as to whether the entry key and the entry data are equal or not. Accordingly, if "001011xx" is provided as an entry key, both entry data "00101xxx" and "0010110x" are determined to be identical to the entry key. It is predetermined that mask data, i.e., invalid data, is provided at successive positions at the LSB side, and never provided at a position between valid data.

Generally, the priority of entry data is determined by the number of masks x. Entry data having the least number of masks x has the highest priority. To the contrary, entry data having the most number of masks x has the lowest priority. For example, the first entry data holds the highest priority among the following entry data, and entry data written in a lower row has lower priority.

"00101001"
"1011100x"
"011000xx"
"11101xxx"
"1001xxxx"

If a plurality of entry data is determined to be identical to an entry key, entry data having the least number of masks x is determined to hold the highest priority. The address of the entry data holding the highest priority is output from a CAM device.

According to the present invention, entry data having the least number of masks x is determined to have the top priority. The predetermined constraint that mask data is provided to successive positions at the LSB side, and is not provided to a position between valid data is utilized for this purpose. For example, it is assumed that "0010111x" is provided as an entry key, and the following entry data are stored:

"0010110x" (the first entry data),
"001011xx" (the second entry data),
"00101xxx" (the third entry data), and
"0010xxxx" (the fourth entry data).

The fourth entry data is determined not to be the identical entry data having the least number of masks x because the fourth bit from the right of the fourth entry data is mask data, and the fourth bit from the right of the first through third entry data, to the contrary, is valid data. Similarly, the third entry data is determined not to be the identical entry data having the least number of masks x because the third bit from the right of the third entry data is mask data, and the third bit from the right of the first and third entry data, to the contrary, is valid data. Similarly, the second entry data is determined not to be the identical entry data having the least number of masks x because the second bit from the right of the second entry data is a mask data, and the second bit from the right of the first entry data, to the contrary, is valid data. Accordingly, the second through fourth entry data are determined not to be the entry data, identical to the entry key, having the least number of masks x. Therefore, the remaining first entry data is determined to be the identical entry data having the least number of masks.

Hereinafter, entry data, identical to an entry key, having the least number of mask data, i.e., entry data having the most number of valid data, is called "longest match" entry data.

According to the present invention, each ternary cell 10 has an informing function. The informing function is a function of a ternary cell 10 which stores valid entry data identical to an entry key to inform other ternary cells 10 at the same bit position of other entry data identical to the entry key that the ternary cell 10 stores valid entry data. Once informed that the ternary cell 10 stores valid entry data, the other ternary cells 10 at the same bit position of other entry data know that the other entry data is identical to the entry data but is not "longest match" if their ternary data is invalid; the match lines ML of the other ternary cells 10 are turned to a LOW level.

According to the present invention, in the case that a ternary cell stores mask data in entry data identical to an entry key, and another ternary cell at the same bit position stores valid data of another entry data identical to the entry key, the ternary cell storing the mask data determines that its entry data does not have the highest priority, and is not a candidate for entry data having the highest priority. Accordingly, no entry data except for the top priority data survives after this procedure.

Figure 3:
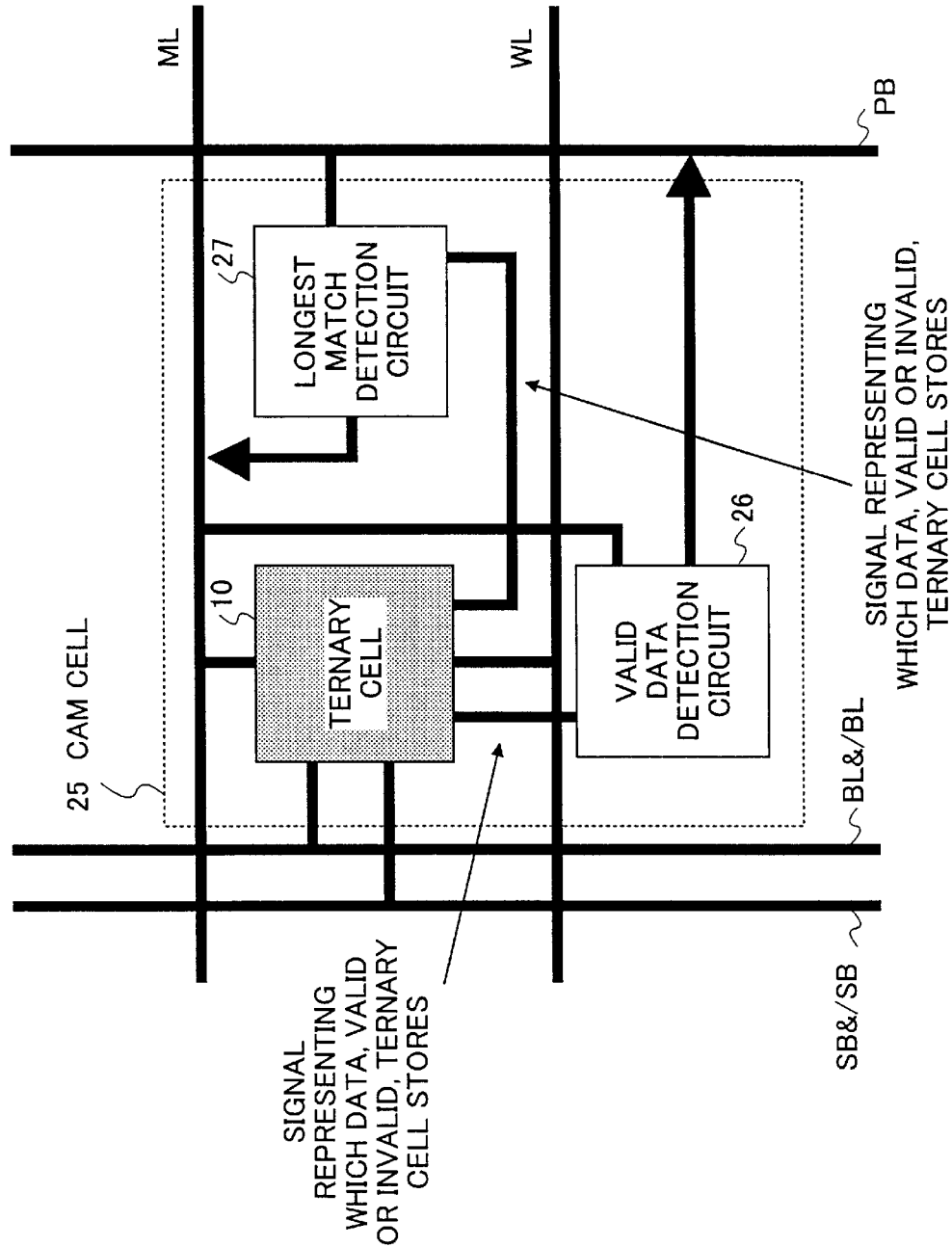
FIG. 3 is a block diagram showing a cell configuration of a content addressable memory device relative to an embodiment of the present invention.

FIG. 3 is a schematic block diagram showing a cell configuration of a content addressable memory device, an embodiment of the present invention.

According to the present invention, a CAM cell 25 includes a ternary cell 10, a valid data detection circuit 26, and a longest-match detection circuit 27. The valid data detection circuit 26 has the informing function described above.

The ternary cell 10 is, for example, a ternary cell shown in FIG. 1, and stores ternary data, either 1, 0, or x (mask or mask prefix). Entry data is stored in the ternary cell 10 by providing signals corresponding to the entry data to bit lines BL and /BL (as shown in FIG. 1, BL includes BL(1) and BL(2), and /BL includes /BL(1) and /BL(2)) and activating a word line WL. An entry key is provided through search buses SB and /SB.

The valid data detection circuit 26 receives, as input signals, both a signal provided by the ternary cell 10 indicating which data, either valid or invalid, is stored in the ternary cell 10 and a signal provided through a match line ML. When all CAM cells connected to a common word line, i.e., all CAM cells jointly storing an entry datum, store ternary data identical to those of the entry key, the valid data detection circuit 26 receives a HIGH signal through the match line ML. If the entry data stored in the ternary cell 10 is valid data, the valid data detection circuit 26 outputs, in response to the HIGH signal received through the match line ML, a signal indicating that the ternary data stored in the CAM cell 25 is valid data. The level of the priority bus PB is, for example, turned to a LOW level.

The longest-match detection circuit 27 receives, from the ternary cell 10, a signal indicating whether ternary data stored in the ternary cell 10 is valid or invalid, and further receives, as an input signal, a signal through the priority bus PB. If the ternary data stored in the ternary cell 10 is invalid data (mask data), the longest-match detection circuit 27 turns the match line ML to a LOW level in response to the signal received through the priority bus PB indicating that other CAM cell stores valid ternary data. Even if the ternary cell 10 stores invalid ternary data (mask data), the longest-match detection circuit 27 does nothing on the match line ML unless a signal indicating that another CAM cell stores valid ternary data is received through the priority bus PB. If the match line ML is at a LOW level from the beginning, the operation of the longest match circuit 27 is irrelevant. If the ternary cell 10 stores valid ternary data, the longest-match detection circuit 27 does nothing on the match line ML.

As described above, the valid data detection circuit 26 is provided with an informing function, and informs other CAM cells 25 at the same bit position through the priority bus PB that ternary data stored in its CAM cell is valid ternary data if entry data which its ternary cell 10 jointly stores is identical to the entry key, and ternary data stored in its ternary cell 10 is valid ternary data. In response to a signal on the priority bus PB indicating the existence of other valid data, the longest-match detection circuit 27 turns the match line ML to a LOW level to indicate a data match if it stores mask data, because it determines that the entry data jointly stored by its CAM cell 25 is not longest match.

According to the present invention, in the case that ternary data stored in a CAM cell 25 shown in FIG. 3 is mask data, and another CAM cell at the same bit position stores valid ternary data, the CAM cell 25 determines that the entry data jointly stored by the CAM cell 25 is not entry data of the top priority, and excludes the entry data from the candidates for the top priority entry data. Entry data finally remaining as a candidate for the top priority entry data is determined to have the highest priority.

Figure 4:
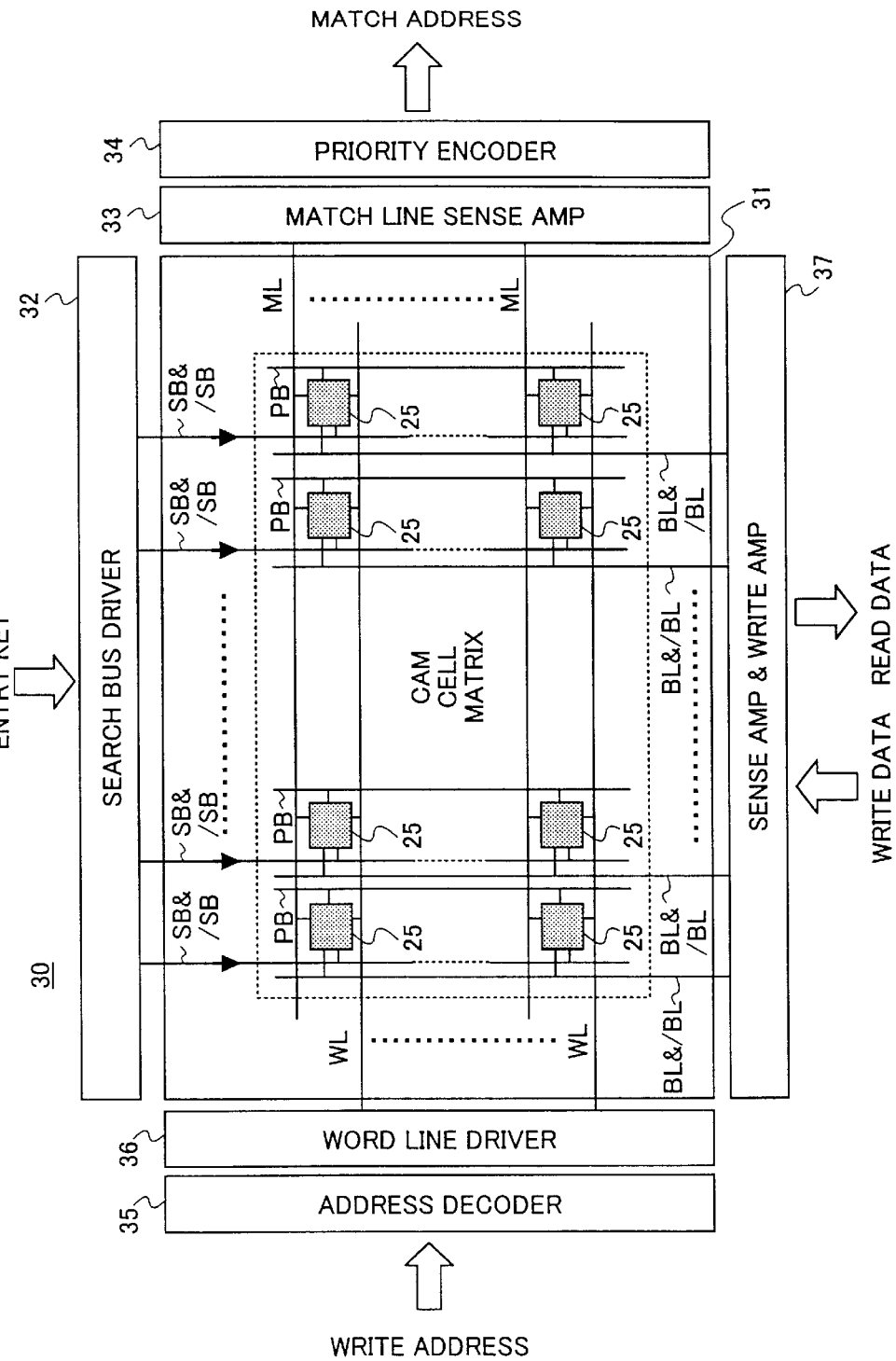
FIG. 4 is a block diagram showing an entire configuration of the content addressable memory device relative to an embodiment of the present invention.

FIG. 4 is a schematic block diagram showing a total configuration of a content addressable memory device according to the present invention.

The content addressable memory device 30 shown in FIG. 4 includes a CAM cell matrix 31, a search bus driver 32, a match line sense amp 33, a priority encoder 34, an address decoder 35, a word line driver 36, and a sense amp & write amp 37.

The CAM cell matrix 31 is provided with CAM cells 25 in every row and every column as shown in FIG. 3. Search buses SB and /SB from the search bus driver 32, word lines WL from the word line driver 36, and bit lines BL and /BL from the sense amp & write amp 37 are connected to each CAM cell 25. CAM cells 25 connected to a common word line WL also share a match line ML. The match lines ML are connected to the match line sense amp 33. CAM cells 25 corresponding to the same bit position of entry data share the priority buses PB. As described with reference to FIG. 3, a signal indicates the existence of valid ternary data in entry data identical to an entry key.

The search bus driver 32 drives the search buses SB in response to an entry key input from the exterior of the device. The address decoder 35 decodes a write address input from the exterior of the device, and outputs the result of the decoding to the word line driver 36. The word line driver 36 activates a word line WL corresponding to an input address based on the result of the decoding. The sense amp & write amp 37 provides write data input from the exterior of the device after amplifying the write data, and outputs data retrieved from the CAM cell matrix 31 after amplifying the data. The match line sense amp 33 provides a signal on the match line ML to the priority encoder 34 after amplifying the signal. The priority encoder 34 encodes an address corresponding to "longest match" match line ML, and outputs to the exterior of the device as an address of the top priority matched data.

If a plurality of match lines ML indicating the existence of entry data identical to an entry key, the priority encoder 34 outputs, for example, an address of the matched entry data having the lowest address as the address of the highest priority matched data to the exterior of the device.

According to the principle of the present invention, entry data having a lower priority (i.e., not "longest match") is determined not to be a candidate for the highest priority entry data by the informing function. Accordingly, only one match line ML is expected to indicate the "longest match".

However, a problem is caused in such a case that "001011xx" is an entry key and the following entry data identical to the entry key exists:

"0010110x" (the first entry data)
"0010111x" (the second entry data)
"00101xxx" (the third entry data)
"0010xxxx" (the fourth entry data)

In such a case, both the first entry data and the second entry data are determined to be the longest match entry data. It is desirable that the priority encoder 34 be prepared for such a case that a plurality of match lines ML indicates entry data matching.

Figure 5:
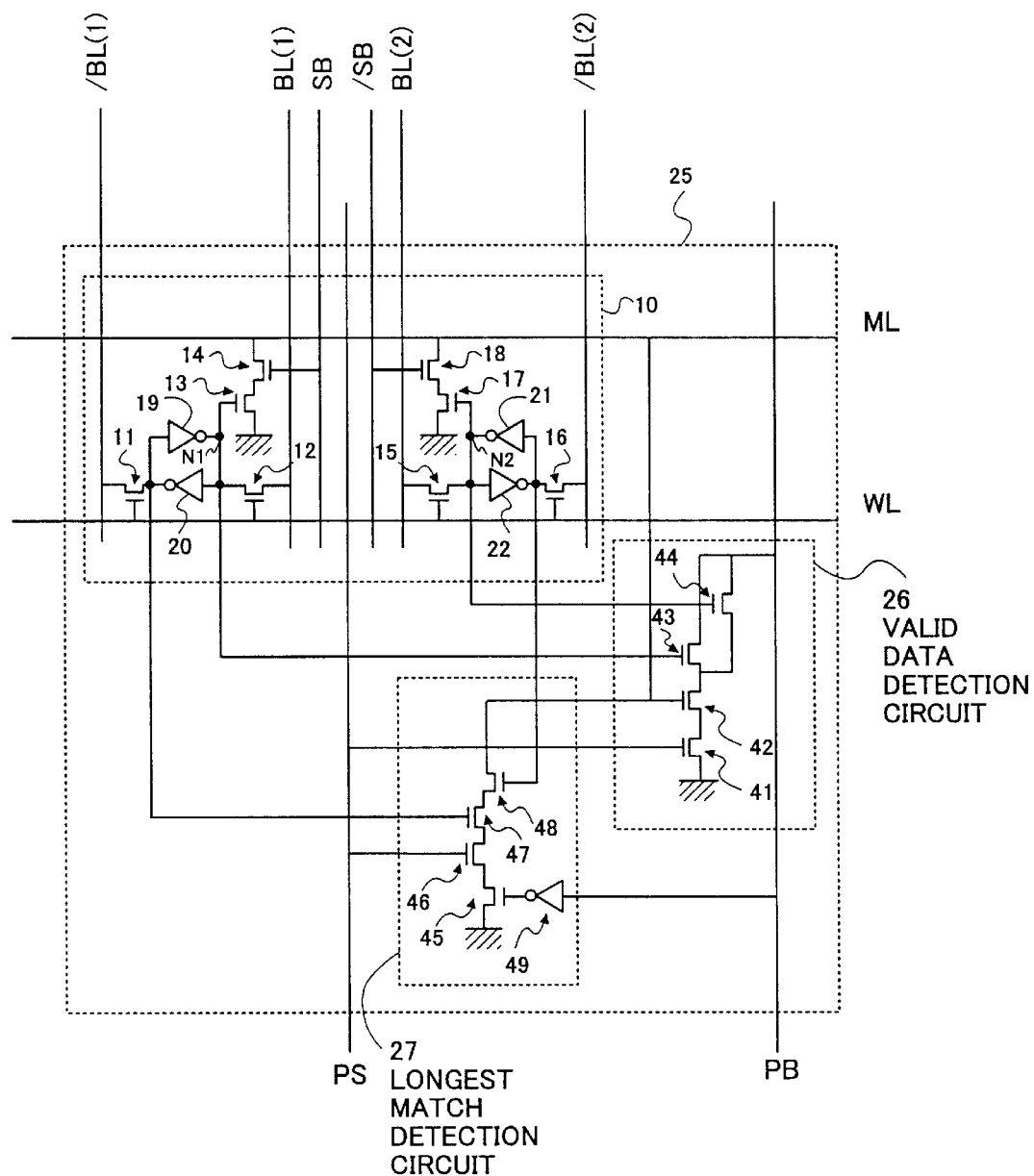
FIG. 5 is a circuit diagram showing a cell configuration of the content addressable memory device relative to an embodiment of the present invention.

FIG. 5 is a circuit diagram of the CAM cell 25 of the present invention.

The CAM cell 25 shown in FIG. 5 includes a ternary cell 10, a valid data detection circuit 26, and a longest-match detection circuit 27 as shown in FIG. 4.

The ternary cell 10 includes NMOS transistors 11–18 and inverters 19–22. The inverters 19 and 20 form a 1-bit latch, and the inverters 21 and 22 form another 1-bit latch. When the ternary cell 10 stores 1, a node N1 is set at 0, and a node N2 is set at 1. When the ternary cell 10 stores 0, the node N1 is set at 1, and the node N2 is set at 0. When the ternary cell 10 stores mask data x, both the node N1 and the node N2 are set at 0. Data is stored by providing a signal corresponding to the data to bit lines BL(1), /BL(1), BL(2), and /BL(2) and activating a word line WL. The operation of the ternary cell 10 has been described in detail with reference to FIG. 1.

A valid data detection circuit 26 includes NMOS transistors 41–44. The gate of the NMOS transistor 41 is provided with a signal through a control signal line PS. The gate of the NMOS transistor 42 is provided with a signal through a match line ML. The gate of the NMOS transistor 43 is provided with a signal from the node N1 of the ternary cell 10. The gate of the NMOS transistor 44 is provided with a signal from the node N2 of the ternary cell 10. If the match line ML is at a HIGH level indicating that the entry data is identical to the entry key and ternary data stored in the ternary cell 10 is a valid data, the valid data detection circuit 26 turns a priority bus PB to a LOW level. The valid data detection circuit 26 informs, through this operation, other CAM cells at the same bit position that its CAM cell stores valid data.

At an initial state, the match line ML is at a HIGH level by being pre-charged or pulled up. At the initial state, the control signal line PS is fixed at a LOW level so that the circuits do not malfunction before a signal corresponding to the entry key is provided to search buses SB and /SB. That is, the operation of determining whether the ternary data stored in the cell is identical or not is not performed before the entry key is provided to the search buses SB and /SB. Until this operation is performed, the match line ML remains at a HIGH level. If the ternary data stored in the cell is valid data, however, the valid data detection circuit 26 turns the priority bus PB to a LOW level even if the entry data is identical to the entry key. To avoid this problem, the control signal line PS is fixed at a LOW level at the initial state, and then, set at a HIGH level.

In the valid data detection circuit 26, the NMOS transistor 42 becomes conductive while the match line ML is set at a HIGH level because the entry data is identical to the entry key. If the data stored in the ternary cell 10 is valid, the NMOS transistor 43 or 44 becomes conductive. The NMOS transistor 41 is also conductive since the control signal line PS is at a HIGH level as described above. Accordingly, in the case that the match line ML is at a HIGH level because of an identical entry data and the ternary data stored in the ternary cell 10 is valid data, the valid data detection circuit 26 sets the priority bus PB to a LOW level.

The longest-match detection circuit 27 includes NMOS transistors 45 through 48 and an inverter 49. The gate of the NMOS transistor 45 receives an inverted signal of the signal on the priority bus PB through the inverter 49. The gate of the NMOS 46 is provided with a signal through the control signal line PS. The gate of the NMOS 47 is provided with an inverted signal of the node N1 of the ternary cell 10. The gate of the NMOS transistor 44 receives an inverted signal of the node N2 of the ternary cell 10.

The NMOS transistor 45 becomes conductive in response to a LOW level signal on the priority bus PB informing other ternary cells of the existence of valid data. If the data stored in the ternary cell 10 is invalid data (mask data x), the nodes N1 and N2 remain at a LOW level. The NMOS transistors 47 and 48 become conductive when an inverted signal of the respective nodes is provided at their gates. The NMOS transistor 46 is also conductive since the control signal line PS is at a HIGH level as described above. Accordingly, in the case that the priority bus PB is at a LOW level for informing other ternary cells of the existence of other valid data and ternary data stored in the ternary cell 10 is invalid data, all transistors 45–48 turn to a conductive state, and set the match line ML at a LOW level.

The valid data detection circuit 26 has a informing function, and informs other CAM cells 25 at the same bit position that its own ternary cell 10 stores valid data by turning the priority bus PB to a LOW level in case that the entry data stored in its own ternary cell is valid and identical to the entry key. In response to the signal reporting the existence of valid data through the priority bus PB, the longest-match detection circuit 27 turns the match line ML which indicates data matching to a LOW level since, if its data is mask data, the longest-match detection circuit 27 knows that the entry data jointly stored by its CAM cell 25 is not the longest-match.

Figure 6:
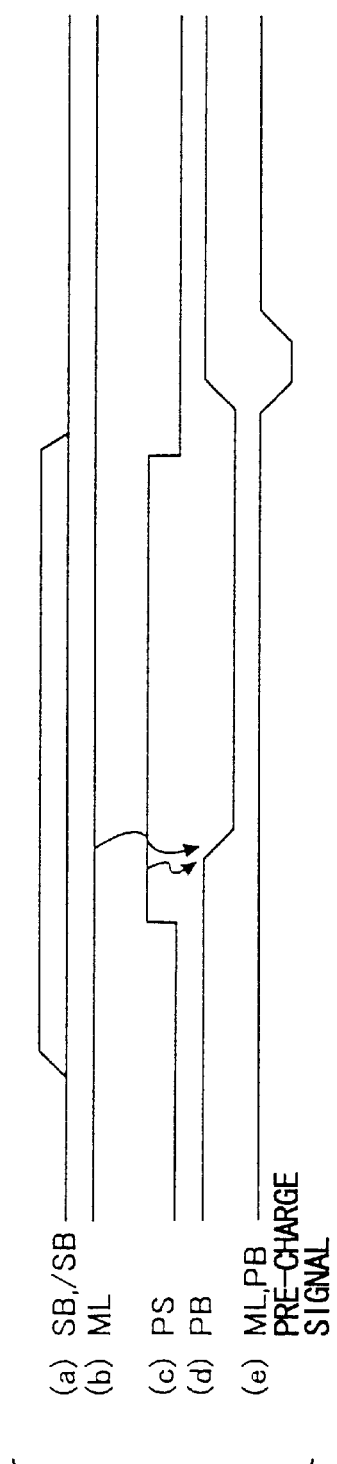
FIG. 6 is a timing chart showing changes in each signal in the case that entry data is identical to an entry key and ternary data stored in a cell is valid.

FIG. 6 is a timing diagram showing the change of each signal in the case that entry data is valid and identical.

In FIG. 6, (a) is a signal on the search bus SB and /SB; (b) is a signal on the match line ML; (c) is a signal on the control signal line PS; (d) is a signal of the priority bus PB; (e) is a signal on the match line ML and a signal to pre-charge the priority bus PB. As shown in FIG. 6, the control signal line PS is set at a HIGH level after the signal on the search buses SB and /SB changes. In the case that the entry data is identical to entry key and the ternary data stored in its cell is valid data, a signal on the priority bus PB is turned to a LOW level in response to a valid data signal (not shown), a HIGH signal on the control signal line PS, and a HIGH signal on the match line ML. In the case shown in FIG. 6, the signal on the match line ML stays at a HIGH level even if the signal on the priority bus PB turns to a LOW level since the ternary data stored in its cell is valid. After the signals on the search buses SB and /SB are driven, the priority bus PB and the match line ML are pre-charged, and turn to a HIGH level.

Figure 7:
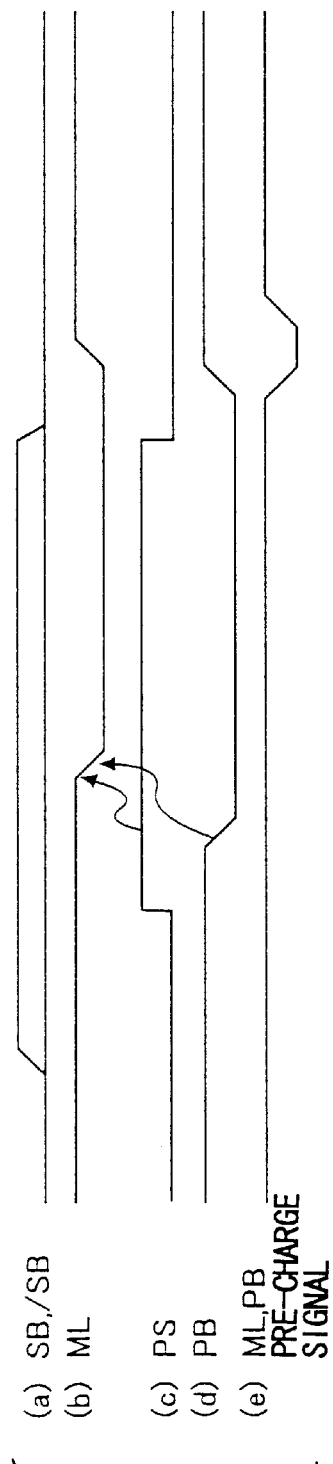
FIG. 7 is a timing chart showing changes in each signal in the case that entry data is identical to an entry key but ternary data stored in a cell is invalid (another cell at the same bit position stores valid data)

FIG. 7 is a schematic timing diagram showing changes in each signal in the case that entry data is identical to an entry key and the ternary data stored in the cell is invalid data, and that another cell at the same bit position stores valid data.

As shown in FIG. 7, the control signal line PS is set at a HIGH level in response to a change in the signal on the search buses SB and /SB. If the entry data is identical to the entry key and its cell stores invalid data, the CAM cell 25 does not turn the priority bus PB to a LOW level. In the case shown in FIG. 7, however, the signal on the priority bus PB turns to a LOW level since another CAM cell 25 at the same bit position stores valid data. The signal on the match line ML is turned to a LOW level in response to a fall in the signal on the priority bus PB because the ternary data stored in its cell is invalid. After the signal on the search buses SB and /SB are changed, the priority bus PB and the match line bus ML are pre-charged to a HIGH level.

Figure 8:
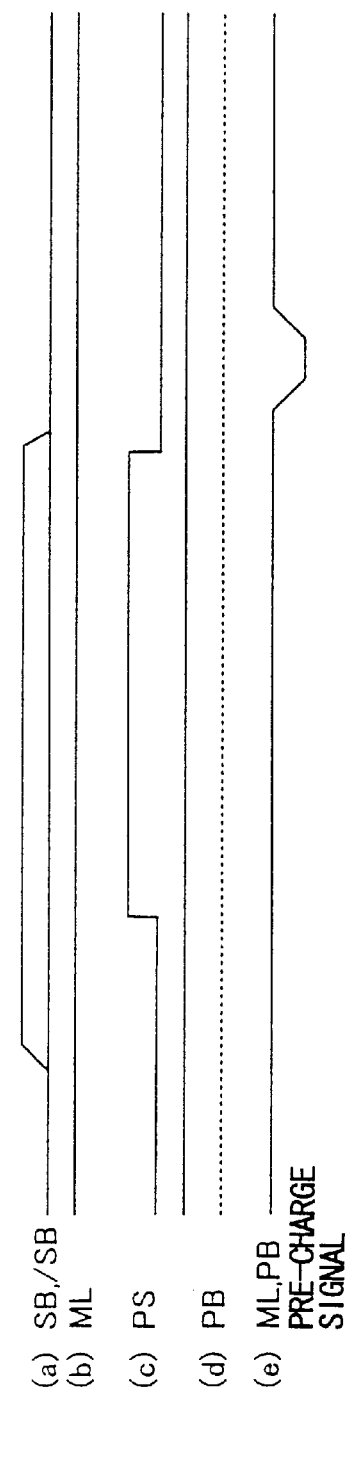
FIG. 8 is a timing chart showing changes in each signal in the case that entry data is identical to an entry key but ternary data stored in a cell is invalid (no cell at the same bit position stores valid data)

FIG. 8 is a timing chart showing changes in each signal in the case that the entry data is identical to the entry key, and the ternary data stored in the cell is invalid, and that no other cells at the same bit position stores valid data.

As shown in FIG. 8, after the signal on the search buses SB and /SB are switched, the control signal line PS is set at a HIGH level. If entry data is identical to an entry key, and the ternary data stored in a cell is invalid, the CAM cell 25 does not turn the priority bus PB to a LOW level. In the example shown in FIG. 8, since no other CAM cell 25 at the same bit position stores valid data, the priority bus PB remains at a HIGH level. Accordingly, the match line ML remains at a HIGH level. After the search buses SB and /SB are switched, the priority bus PB and the match line ML are pre-charged to a HIGH level.

Figure 9:
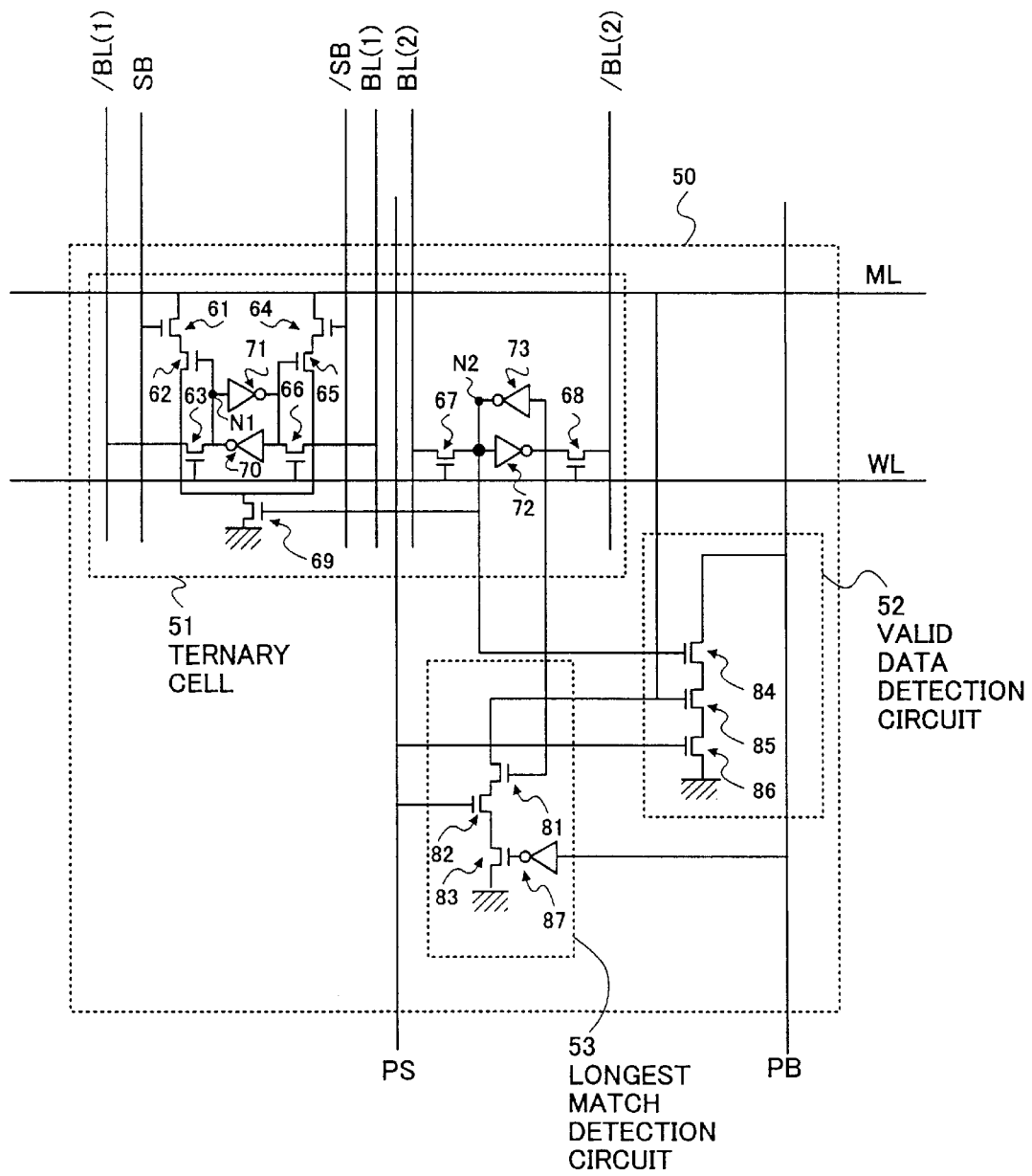
FIG. 9 is a circuit diagram showing a cell configuration of the content addressable memory device relative to another embodiment of the present invention.

FIG. 9 is a circuit diagram of a CAM cell 25 relative to an embodiment of the present invention.

The CAM cell 50 shown in FIG. 9 includes a ternary cell 51, a valid data detection circuit 52, and a longest-match detection circuit 53.

The ternary cell 51 includes NMOS transistors 61 through 69 and inverters 70 through 73. Inverters 70 and 71 form a 1-bit latch, and inverters 72 and 73 form another 1-bit latch. The ternary cell 51 stores "1" by setting a node N1 at 0 and a node N2 at 1. The ternary cell 51 stores "0" by setting the node N1 at 1 and the node N2 at 1. The ternary cell 51 stores mask data x by setting the node N1 at either 0 or 1 and the node N2 at 0. Data is stored by providing signals corresponding to the data to bit lines BL(1), /BL(1), BL(2), and /BL(2), and activating a word line WL.

A valid data detection circuit 52 includes NMOS transistors 84 through 86. If a match line ML is at a HIGH level indicating that entry data is identical to an entry key, the NMOS transistor 85 becomes conductive. If ternary data stored in the ternary cell 51 is valid, the node N2 is at a HIGH level, and the NMOS transistor 84 becomes conductive. Because a control signal line PS is at a HIGH level, the NMOS transistor 86 is also conductive. Accordingly, the valid data detection circuit turns the priority bus to a LOW level when the match line ML is at a HIGH level indicating that the entry data is identical to the entry key, and the ternary data stored in the ternary cell 51 is valid.

The longest-match detection circuit 53 includes NMOS transistors 81 through 83 and inverter 87. Once the priority bus PB is turned to a LOW level indicating the existence of other valid data, the NMOS transistor 83 becomes conductive. If the ternary data stored in the ternary cell 51 is invalid data (mask data x), the node N2 is at a LOW level, and the NMOS transistor 81 which is provided an inverted signal of the node N2 becomes conductive. Since the control signal line is at a HIGH level, the NMOS transistor 82 is also conductive. Accordingly, if the priority bus PB is at a LOW level to indicate the existence of other valid data, and the ternary data stored in the ternary cell 51 is invalid, all NMOS transistors 81 through 83 become conductive, and turn the match line ML to a LOW level.

As described above, the valid data detection circuit 52 is provided with an informing function, and if entry data stored in its ternary cell 51 is identical to the entry key, and its ternary data is valid, informs other CAM cells 50 at the same bit position that its data is valid by turning the priority bus PB to a LOW level. Once the existence of other valid data is reported through the priority bus PB, the longest-match detection circuit 53 acknowledges, if ternary data stored in its cell is mask data, that the entry data stored in its CAM cell 50 is not longest match, and turns the match line ML to a LOW level to indicate data match.

Compared to the configuration of the CAM cell 25 shown in FIG. 5, the configuration of the CAM cell 50 shown in FIG. 9 requires less NMOS transistors to form the valid data detection circuit 52 and the longest match detection circuit 53. Because many CAM cells are required to form the CAM cell matrix 31 as shown in FIG. 4, even a small reduction in the quantity of circuit components is effective in order to reduce the chip size of the CAM cell matrix 31.

FIG. 10 is a schematic drawing of the control mechanism of the control signal lines PS.

In the description given above, it is assumed that all control signal lines PS of a word are simultaneously switched to a HIGH level. That is, control signal lines PS corresponding to all CAM cells 25 (or 50) storing a word turns to a HIGH level, and a valid data detection circuit and a longest-match detection circuit in each CAM cell operate simultaneously. However, if valid data are stored in all CAM cells at the same position of a word, operation of the valid data detection circuit and the longest-match detection circuit is not necessary. Accordingly, if all ternary data at the same bit position are valid, the control signal line PS corresponding to the bit position is not turned to a HIGH level to save on power consumption.

Figures 10A, 10B:
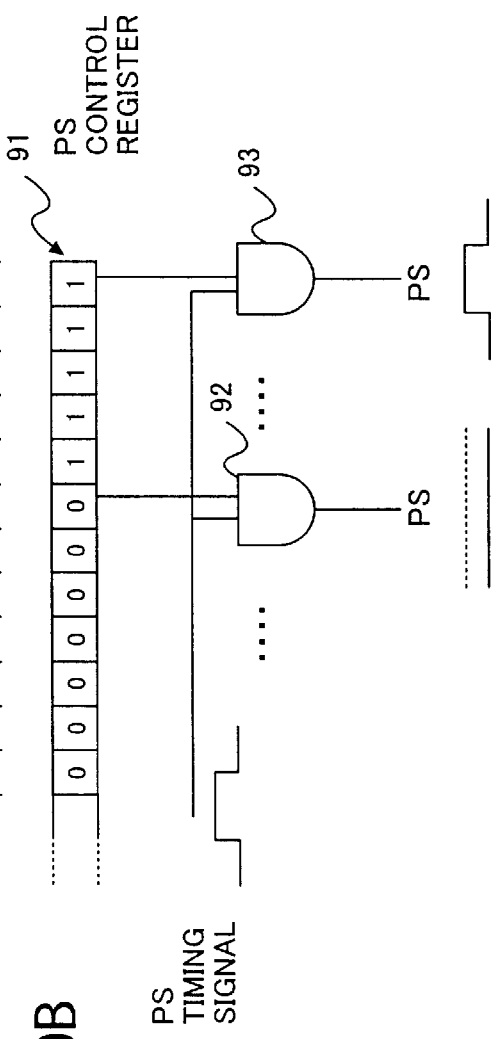
FIGS. 10A and 10B are schematic diagrams showing a control mechanism of control signal lines.

As shown in FIG. 10A, it is assumed that the maximum number of mask data (the number of mask prefix) in entry data stored in a cell matrix is 5. A PS control register 91 which controls the control signal lines PS is provided as shown in FIG. 10B, and stores either 0 or 1 corresponding to the number of the longest mask data. In this example, five 1s, corresponding to the number of the longest mask data, are arranged in the PS control register 91 continuously from the right. Zeros are stored in the other bits.

Furthermore, a plurality of AND circuits is provided to each bit of the PS control register 91. For example, the AND circuit 92 corresponds the sixth bit from the right of the PS control register 91; the AND circuit 93 corresponds to the first bit on the right of the PS control register. These AND circuits perform an AND operation of the PS timing signal and each bit of the PS control register 91, and produce a signal for control signal lines PS corresponding to each bit position. Through this process, the valid data detection circuit and the longest-match detection circuit are operated only at the positions of mask data of entry data having the longest mask data. Therefore, the configuration shown in FIGS. 10A and 10B saves power otherwise wasted by useless circuit operations.

Figure 11:
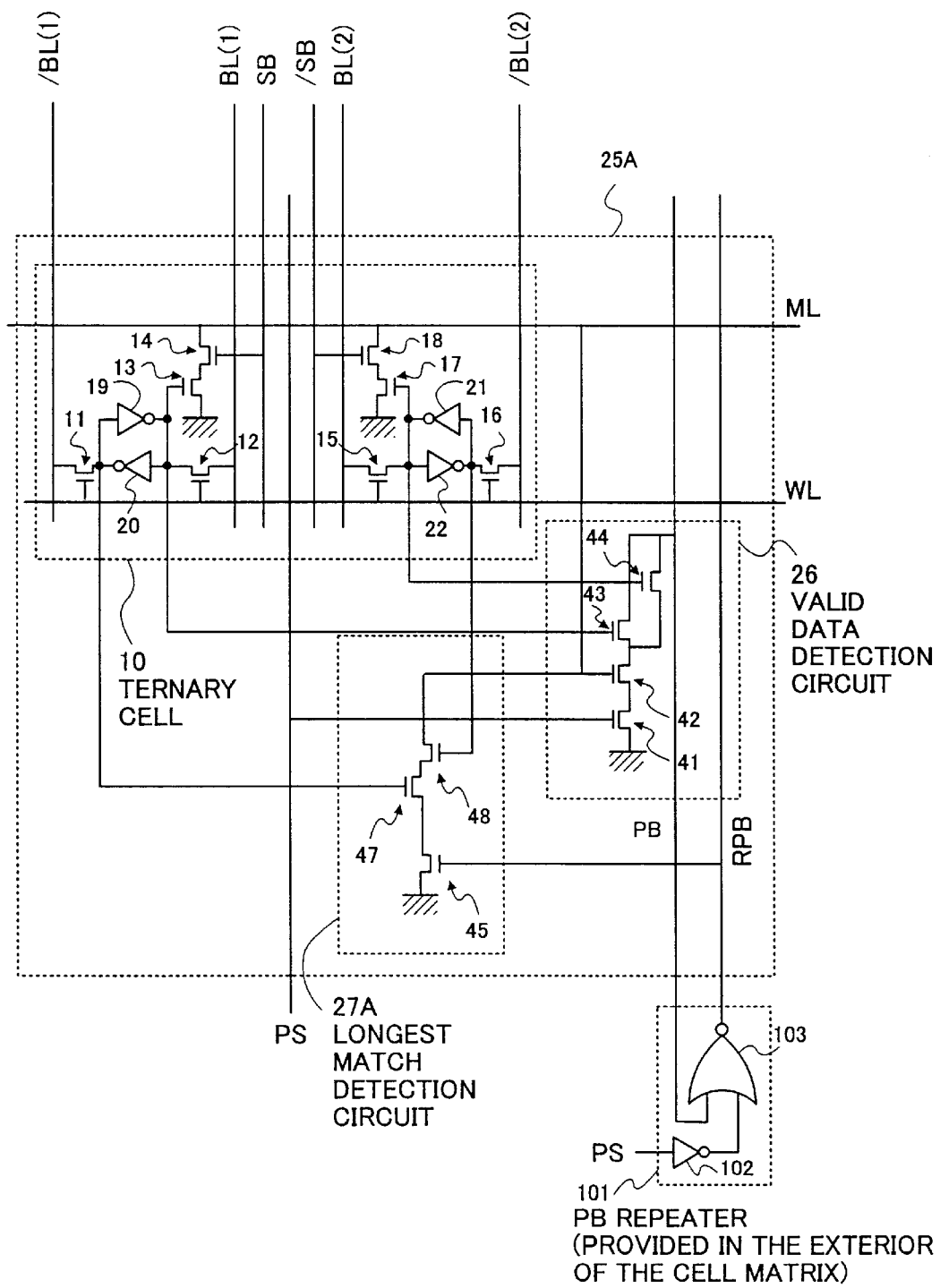
FIG. 11 is a circuit diagram showing a cell configuration, to which a PB repeater is added, of the content addressable memory device relative to the embodiment shown in FIG. 5.

FIG. 11 is a circuit diagram of a CAM cell and its peripheral circuitry as another embodiment of the present invention. In FIG. 11, the components previously described with reference to FIG. 5 are referred to by the same numerals, and their description is omitted.

The CAM cell 25A shown in FIG. 11 includes a ternary cell 10, a valid data detection circuit 26, and a longest-match detection circuit 27A. The ternary cell 10 and the valid data detection circuit 26 are identical to those shown in FIG. 5. The longest-match detection circuit 27A does not include the inverter 49 and the NMOS transistor 46 both included in FIG. 5.

The valid data detection circuit 26 is connected to the priority bus PB in the same manner as FIG. 5. If the match line ML is at a HIGH level indicating that entry data is identical to an entry key, and the ternary data stored in the ternary cell 10 is valid, the priority bus PB falls to a LOW level.

The priority bus PB is connected to a PB repeater 101. The PB repeater includes an inverter 102 and a NOR circuit 103. The inverter 102 receives a signal from the control signal line PS, and outputs an inverted signal to the NOR circuit 103. Accordingly, when the control signal line PS is at a HIGH level, the NOR circuit 103 operates as an inverter circuit inverting the signal on the priority bus PB. When the control signal line PS is at a LOW level, the output of the NOR circuit 103 is fixed at a LOW level.

The output of the NOR circuit 103 is provided to each CAM cell 25A at the same bit position through a repeat priority bus RPB.

When the priority bus PB is turned to a LOW level, the repeat priority bus RPB is turned to a HIGH level provided that the control signal line PS is at a HIGH level. The HIGH signal on the repeat priority bus RPB is input to the gate of the NMOS transistor 45 in the longest-match detection circuit 27A, and if the ternary data stored in the cell is invalid, the match line ML is turned to a LOW level.

In the configuration shown in FIG. 11, the PB repeater 101 plays the role of the inverter 49 and the NAND circuit 46 in the longest-match detection circuit 27 shown in FIG. 5. The configuration shown in FIG. 11 requires fewer components than that shown in FIG. 5, but it realizes equivalent operation.

Figure 12:
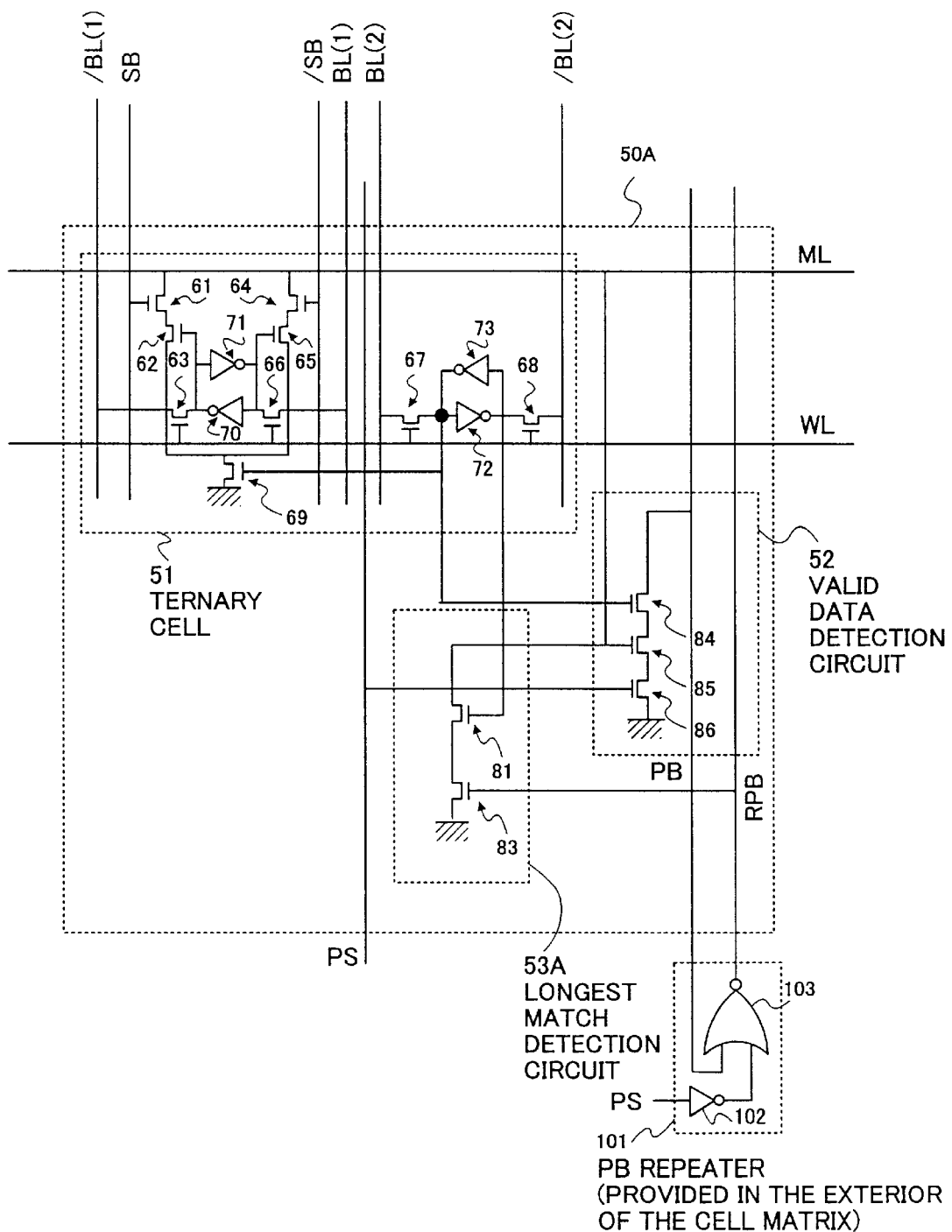
FIG. 12 is a circuit diagram showing a cell configuration, to which a PB repeater is added, of the content addressable memory device relative to the embodiment shown in FIG. 9.

FIG. 12 is a circuit diagram of a CAM cell 50A in which a PB repeater is utilized. In FIG. 12, the components identical to those shown in FIG. 9 are referred to by the same numerals, and their description is omitted.

The CAM cell 50A includes a ternary cell 51, a valid data detection circuit 52, and a longest-match detection circuit 53A. The configurations each of the ternary cell 51 and the valid data detection circuit 52 are the same as those shown in FIG. 9. The longest-match detection circuit 53A does not include the inverter 87 and the NMOS transistor 82 which are included in the longest-match detection circuit 53 shown in FIG. 9.

The priority bus PB is connected to the PB repeater 101. The output from the PB repeater 101 is provided to each CAM cell 25A at the same bit position through the repeat priority bus RPB.

If the priority bus is turned to a LOW level, the repeat priority bus RPB is turned to a HIGH level provided that the control signal line is at a HIGH level. The HIGH signal on the repeat priority bus RPB is input to the gate of the NMOS transistor 83 in the longest-match detection circuit 53A, and, if the ternary data stored in the cell is invalid, turns the match line ML to a LOW level.

In the configuration shown in FIG. 12, the PB repeater 101 plays the role of the inverter 87 and the NAND circuit 82 in the longest-match detection circuit 53 shown in FIG. 9. The configuration shown in FIG. 12 realizes, with fewer components, the operation equivalent to that of the configuration shown in FIG. 9.

Figure 13:
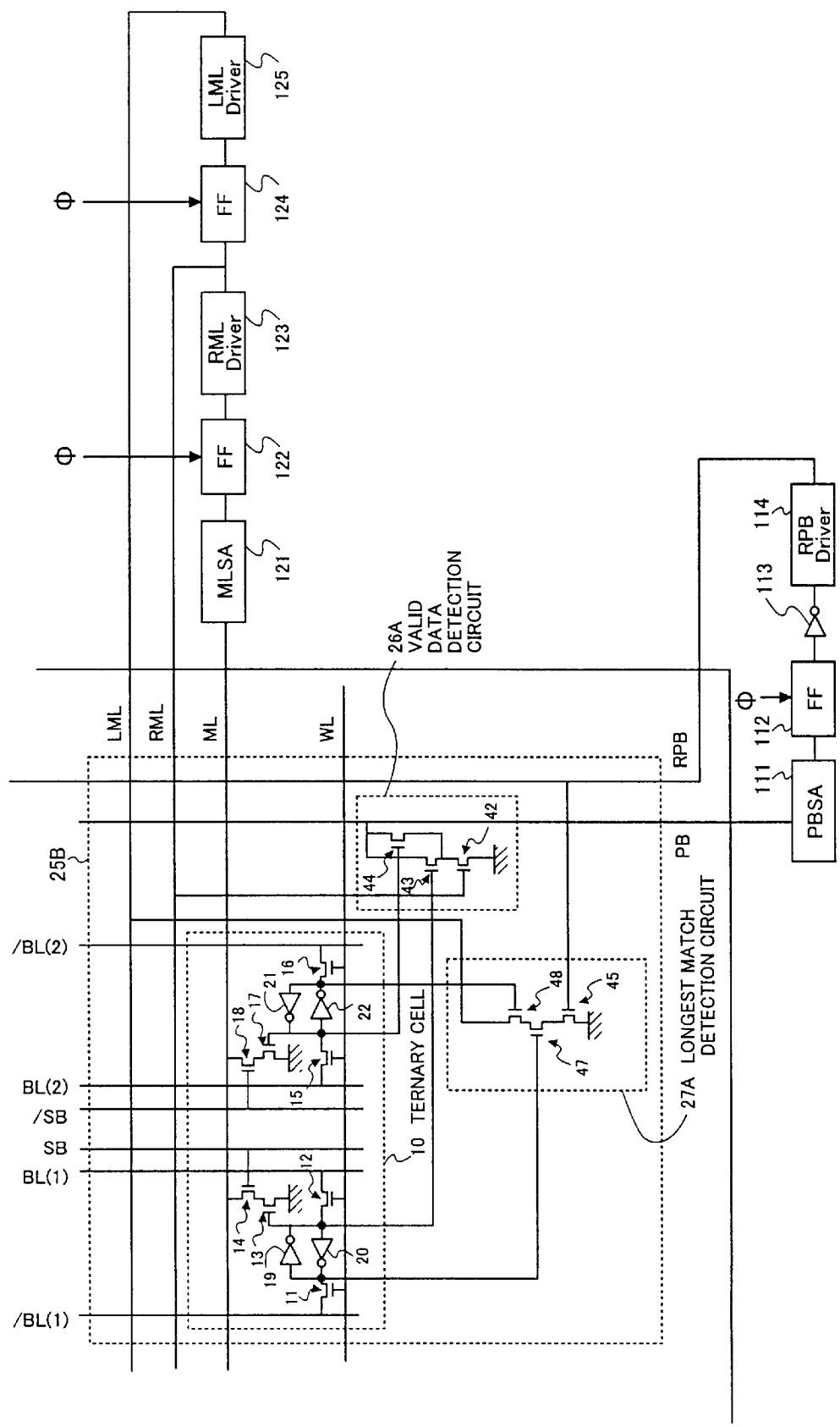
FIG. 13 is a circuit diagram showing a cell configuration, to which other peripheral circuits are added, of the content addressable memory device relative to the embodiment shown in FIG. 5.

FIG. 13 is a circuit diagram of a CAM cell and its peripheral circuitry relative to another embodiment of the present invention. In FIG. 13, the components identical to those shown in FIG. 11 are referred to by the same numerals, and their description is omitted.

The CAM cell 25B shown in FIG. 13 includes a ternary cell 10, a valid data detection circuit 26A, and a longest-match detection circuit 27A. The configurations of the ternary cell 10 and the longest-match detection circuit 27A are the same as those shown in FIG. 11. The valid data detection circuit 26A does not include the NMOS transistor 41 which is included in the valid data detection circuit 26 shown in FIG. 11.

In the configuration shown in FIG. 13, the match line ML is connected to neither the valid data detection circuit 26A nor the longest-match detection circuit 27A. The match line ML is connected to a sense amp 121. A signal on the match line ML is amplified by the ML sense amp 121, and latched by a flip-flop 122 in synchronization with a clock signal Φ. The latched data is input to a RML driver 123. The RML driver drives the repeat match line RML. Accordingly, the signal on the match line ML appears on the repeat match line RML one clock after the clock signal Φ.

The valid data detection circuit 26A is provided an input signal from the repeat match line ML, and connected to the priority bus PB. If the repeat match line RML is at a HIGH level to indicate that the entry data is identical to the entry key, and the ternary data stored in the ternary cell 10 is valid, the priority bus PB is turned to a LOW level.

The priority bus PB is connected to a PB sense amp 111. A signal on the priority bus PB is amplified by the sense amp 111, and latched by a flip-flop 112 in synchronization with the clock Φ. The latched data is provided to an RPB driver 114 through an inverter 113. The RPB driver 114 drives the repeat priority bus RPB. Accordingly, an inverted signal of the priority bus PB appears on the repeat priority bus RPB one clock after the clock signal Φ.

The repeat priority bus RPB is connected to each CAM cells at the same bit position.

Figure 14:
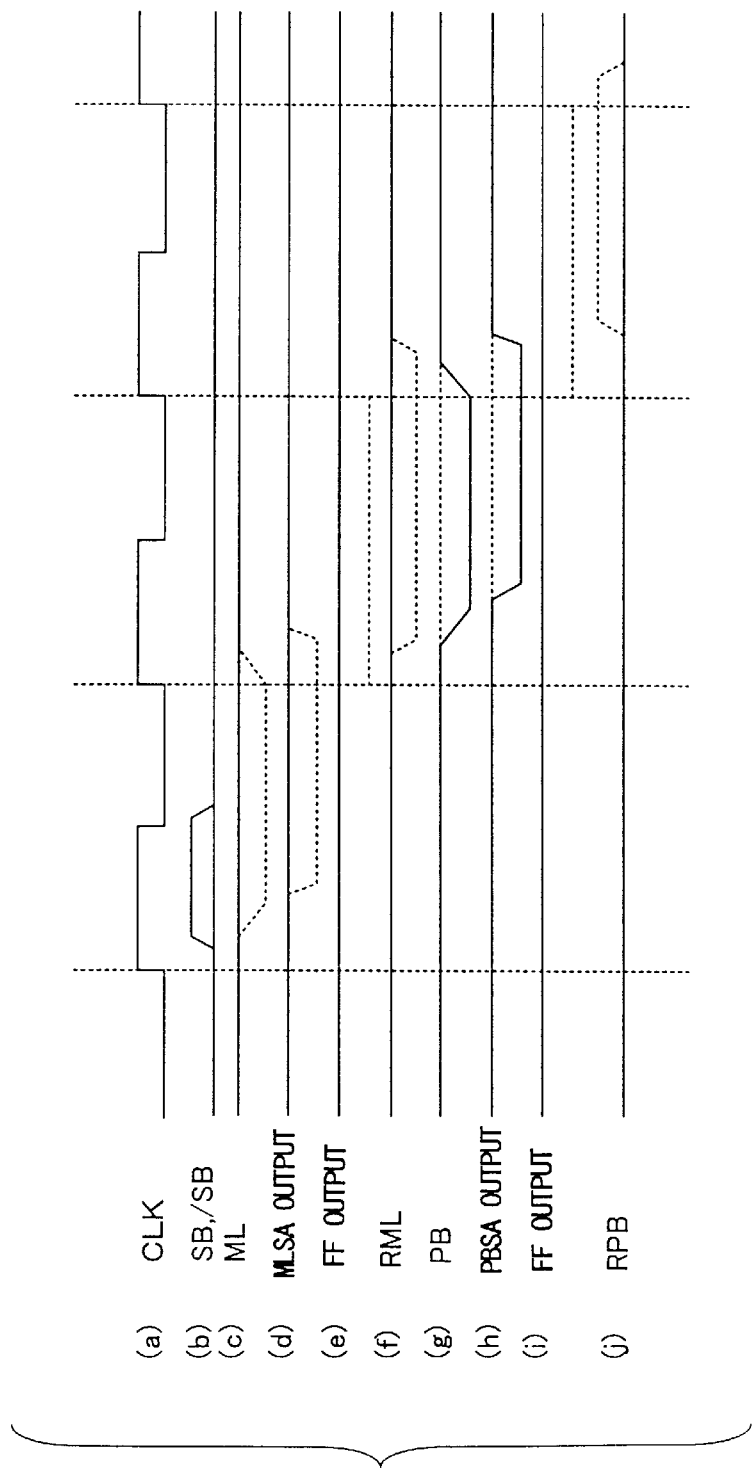
FIG. 14 is a timing chart showing changes in each signal of the cell configuration shown in FIG. 13 (from the activation of the search buses SB and /SB to the switching of the repeat priority bus RPB)

FIG. 14 is a schematic timing chart showing the activation of the search buses SB and /SB and the change in the repeat priority bus RPB signal of the configuration shown in FIG. 13. In FIG. 14, (a) is the clock signal (Φ shown in FIG. 13); (b) is the signal on the search buses SB and /SB; (c) is the signal on the match line ML; (d) is the output of the ML sense amp 121; (e) is the output of the flip-flop 122; (f) is the signal on the repeat match line RML; (g) is the signal on the priority bus PB; (h) is the output of the PB sense amp 111; (i) is the output of the flip-flop 112; and (j) is the signal on the repeat priority bus RPB.

As shown in FIG. 14, the priority bus PB falls to a LOW level one clock after the match line ML falls to indicate the result of matching. The repeat priority bus RPB rises to a HIGH level one clock after the fall in the priority bus PB.

The HIGH signal on the repeat priority bus RPB is input to the gate of the NMOS transistor 45 in the longest-match detection circuit 27A. If the ternary data stored in the cell is invalid data, the longest match line LML is turned to a LOW level.

The signal on the repeat match line RML is input to the flip-flop 124, and latched in synchronization with the clock Φ. The latched data is provided to the LML driver 125; the LML driver 125 drives the longest match line LML. Accordingly, the signal on the repeat match line RML appears on the longest match line LML one clock after the clock signal Φ.

As described above, the signal on the match line ML is transmitted to the repeat match line RML one clock after the clock signal Φ, and the signal on the repeat match line RML is further transmitted to the longest match line LML one clock after the clock signal Φ. The valid data detection circuit 26A informs, if the entry data is identical to the entry key and the ternary data stored in the cell is valid, other cells of the existence of valid data through the repeat priority bus RPB in response to the signal on the repeat match line RML. If the repeat priority bus RPB reports the existence of valid data, and ternary data stored in its cell is invalid, the longest-match detection circuit 27A turns the longest match line LML to a LOW level.

As described above, the signals on the match line ML, the repeat match line RML, and the longest match line LML are separated based on each cycle of the clock signal Φ. The matching determination is performed based on the signal on the match line ML. After the existence of valid data is reported by the signal on the repeat match line RML, the result of the longest match determination is transmitted to the longest match line LML. Through this process, the matching determination, the report of valid data, and the determination of the longest match are performed in each clock cycle.

Under such situation that each operation is performed in each clock cycle, the pipeline operation generally has advantages. That is, the matching determination of the first entry key is performed in the first cycle; the matching determination of the second entry key and the report of the valid data relative to the first entry key are performed in the second cycle; the matching determination of the third entry key, the report of the valid data relative to the second entry key, and the determination of the longest match relative to the first entry key are performed in the third cycle. In the same manner, the matching determination, the report of the valid data, and the determination of the longest match can be performed in each cycle simultaneously. This pipeline operation significantly reduces the process time required for a series of the longest match determination.

Figure 15:
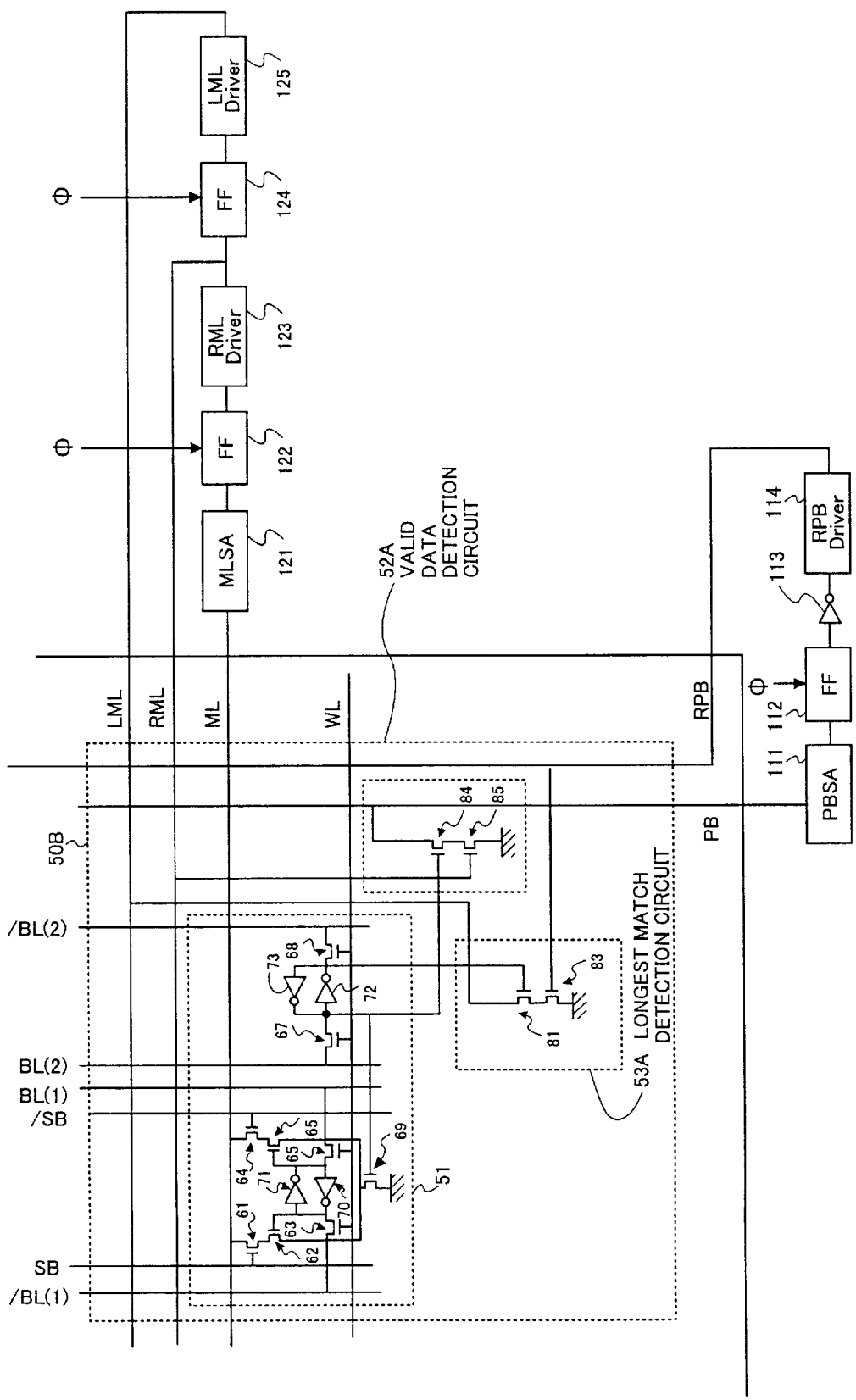
FIG. 15 is a circuit diagram showing a cell configuration, to which other peripheral circuits are added to realize the pipeline operation, of the content addressable memory device relative to the embodiment shown in FIG. 12.

FIG. 15 is a circuit diagram of a variation, realizing the pipeline operation, of the configuration shown in FIG. 12. In FIG. 15, the components identical to those shown in FIG. 12 are referred to by the same numerals, and their description is omitted.

The CAM cell 50B shown in FIG. 15 includes a ternary cell 51, a valid data detection circuit 52A, and a longest-match detection circuit 53A. The ternary cell 51 and the longest-match detection circuit 53A are identical to those in the configuration shown in FIG. 12. The valid data detection circuit 52A does not include the NMOS transistor 86 in the valid data detection circuit 52 shown in FIG. 12.

Since the operation of the configuration shown in FIG. 15 is substantially identical to that of the configuration shown in FIG. 13, its description is omitted. The configuration shown in FIG. 15 realizes the same pipeline operation as shown in FIG. 13.

Figure 16:
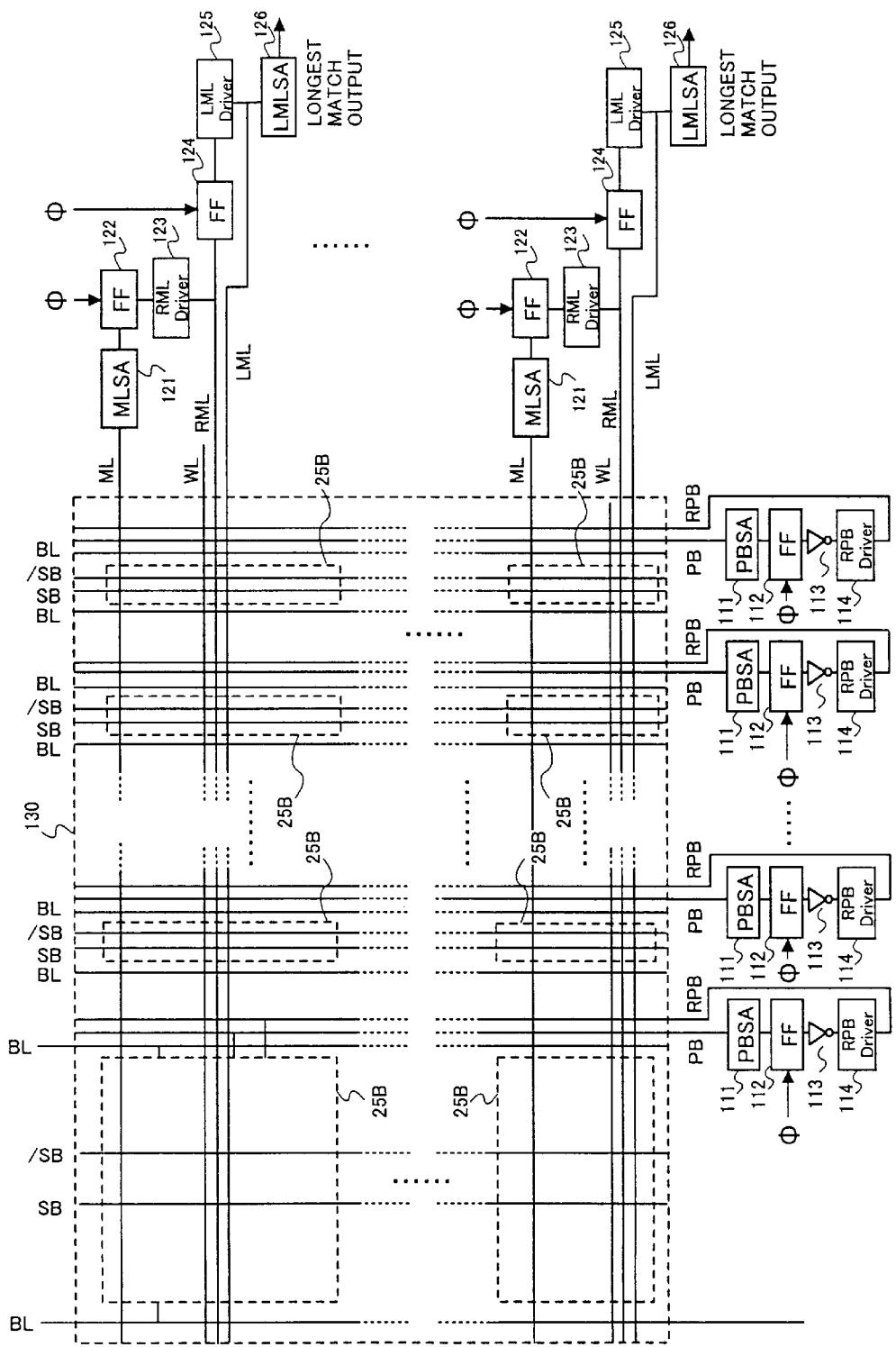
FIG. 16 is a schematic diagram showing an entire configuration of CAM cells which realizes the pipeline operation.

FIG. 16 is a circuit diagram showing the entire CAM cell matrix which realizes the pipeline operation described with reference to FIG. 13.

The CAM cell matrix 130 consists of CAM cells 25B (or 50B) arranged in every row and every column. A PB sense amp 111, a set of a flip-flop 112, an inverter 113, and an RPB driver 114 are provided to each column along the search buses SB and /SB to drive the repeat priority bus RPB in response to the priority bus PB signal. A set of an ML sense amp 121, a flip-flop 122, an RML driver 123, a flip-flop 124, and an LML driver 125 are provided to each row along the word line WL to drive the repeat match line RML and the longest match line LML in response to the match line ML signal. An LML sense amp 126 is further provided to each row to output the longest match line LML signal to the priority encoder 34, for example, after amplifying it.

A single set of the PB sense amp 111, the flip-flop 112, the inverter 113, and the RPB driver 114 is required for each column of the cell matrix, and a single set of the ML sense amp 121, the flip-flop 122, the RML driver 123, the flip-flop 124, and the LML driver 125 is required for each row of the cell matrix. Since the number of the sets is much smaller than the number of cells, the chip size does not increase significantly.

According to the present invention, if ternary data stored in a cell is invalid data, and another cell at the same bit position stores valid data of entry data identical to an entry key, the entry data containing invalid data is determined not to be a candidate for the top priority entry data. The last entry data not determined not to be a candidate is determined to be the top priority data.

Accordingly, the top priority entry data is determined without assigning priority to each memory address. Compared to the conventional technology which relied on the relationship between a memory address and a priority, the performance of memory system is significantly improved.

The present invention is not limited to these embodiments, but various variations and modifications may be made without departing from the scope of the present invention.

This patent application is based on Japanese priority patent application No. 2001-107444 filed on Apr. 5, 2001, the entire contents of which are hereby incorporated by reference.

What is claimed is:

1. A content addressable memory, comprising:

ternary cells which are arranged in rows and columns, and each stores therein "0", "1", or invalid data, wherein both "0" and "1" are valid data;

valid data detection circuits, each of which is provided for a corresponding one of said ternary cells; and longest-match detection circuits, each of which is provided for a corresponding one of said ternary cells;

wherein a valid data detection circuit provided for a first ternary cell located at a given bit position in a first row informs a second ternary cell located at said given bit position on a second row of presence of valid data if said first ternary cell has valid data stored therein and if entry data of said first row matches an entry key; and a longest-match detection circuit provided for said second ternary cell located at said given bit position on said second row finds entry data of said second row to be invalid if said second ternary cell has invalid data stored therein and if said valid data detection circuit is informing said longest-match detection circuit of the presence of valid data.

2. The content addressable memory as claimed in claim 1, further comprising match lines provided for each row, initially set at a first state, and said first ternary cell sets a match line corresponding to said first row at a second state if ternary data stored in said first ternary cell does not match ternary data at said given bit position of said entry key, wherein said longest-match detection circuit sets a match line provided for said second row at a second state in response to determining said entry data of said second row to be invalid.

3. The content addressable memory as claimed in claim 1, further comprising:

a register which stores a longest valid data length therein; and an activating circuit which activates said valid data detection circuit and said longest-match detection circuit corresponding to bit positions where data are indicated as invalid by said register, and sets said valid data detection circuit and said longest-match detection circuit corresponding to bit positions where data are indicated as valid by said register idle.

4. The content addressable memory as claimed in claim 1, further comprising:
   a priority bus, through which said valid data detection circuit provided for said first ternary cell informs said second ternary cell of existence of valid data; and
   a repeat priority bus through which said longest-match detection circuit is informed of said existence of valid data.

5. The content addressable memory device as claimed in claim 4, wherein an inverted signal of said priority bus is transmitted through said repeat priority bus.

6. The content addressable memory device as claimed in claim 1, further comprising:
   a first match line which is initially set at a first state;
   a second match line which is initially set at a second state and turned to said first state one cycle after the cycle in which said first match line is set at said second state; and
   a third match line which is initially set at said second state and turned to said first state one cycle after the cycle in which said second match line is set at said first state, wherein
      said first ternary cell sets said first match line at said second state by determining whether ternary data stored in each ternary cell is not identical to corresponding ternary data of said entry key;
      said valid data detection circuit provided for said first ternary cell informs said second ternary cell of said existence of valid data by determining whether said second match line is in said first state and ternary data stored in said first ternary cell is valid data;
      said longest-match detection circuit sets said third match line at said second state in response to said determination; and
      said second match line, initially set at said second state, is set at said first state in response to said determination.

7. The content addressable memory device as claimed in claim 6, further comprising:
   a priority bus through which said valid data detection circuit provided for said first ternary cell informs said second ternary cell of existence of valid data; and
   a repeat priority bus through which said longest-match detection circuit is informed of said existence of valid data in response to a signal on said priority bus.

8. A content addressable memory, comprising:
   ternary cells, each of which stores therein "0", "1", or invalid data, wherein "0" and "1" are valid data;
   a valid data detecting circuit which announces presence of valid data at a given bit position of first entry data if one of the ternary cell located at said given bit position of the first entry data has valid data stored therein and if the first entry data matches an entry key, said first entry data being represented by the ternary cells commonly connected to a single word line; and
   a longest-match detecting circuit which finds second entry data to be invalid if one of the ternary cells located at said given bit position of the second entry data has invalid data stored therein while the presence of valid data is being announced at said given bit position by said valid data detecting circuit, said second entry data being represented by the ternary cells commonly connected to another word line.

* * * * *